United States Patent
McCormack et al.

(10) Patent No.: US 9,407,311 B2
(45) Date of Patent: Aug. 2, 2016

(54) CONTACTLESS SIGNAL SPLICING USING AN EXTREMELY HIGH FREQUENCY (EHF) COMMUNICATION LINK

(71) Applicant: Keyssa, Inc., Mountain View, CA (US)

(72) Inventors: Gary D. McCormack, Tigard, OR (US); Ian A. Kyles, West Linn, OR (US)

(73) Assignee: Keyssa, Inc., Campbell, CA (US)

( * ) Notice: Subject to any disclaimer, the term of this patent is extended or adjusted under 35 U.S.C. 154(b) by 359 days.

(21) Appl. No.: 13/657,482

(22) Filed: Oct. 22, 2012

(65) Prior Publication Data

US 2013/0109303 A1 May 2, 2013

Related U.S. Application Data

(60) Provisional application No. 61/550,274, filed on Oct. 21, 2011.

(51) Int. Cl.
*H04B 1/40* (2015.01)
*H04B 5/00* (2006.01)
*H05K 1/02* (2006.01)

(52) U.S. Cl.
CPC ............... *H04B 1/40* (2013.01); *H04B 5/0031* (2013.01); *H05K 1/0243* (2013.01); *H05K 2201/10098* (2013.01)

(58) Field of Classification Search
None
See application file for complete search history.

(56) References Cited

U.S. PATENT DOCUMENTS

| | | | |
|---|---|---|---|
| 2,753,551 A | 7/1956 | Richmond | |
| 3,796,831 A | 3/1974 | Bauer | |
| 3,971,930 A | 7/1976 | Fitzmaurice et al. | |
| 3,987,365 A | 10/1976 | Okada et al. | |
| 4,293,833 A | 10/1981 | Popa | |
| 4,485,312 A | 11/1984 | Kusakabe et al. | |
| 4,497,068 A | 1/1985 | Fischer | |
| 4,525,693 A | 6/1985 | Suzuki et al. | |
| 4,694,504 A | 9/1987 | Porter et al. | |
| 4,771,294 A | 9/1988 | Wasilousky | |

(Continued)

FOREIGN PATENT DOCUMENTS

| CN | 2237914 Y | 10/1996 |
|---|---|---|
| CN | 1178402 A | 4/1998 |

(Continued)

OTHER PUBLICATIONS

Eric A. Juntunen, "60 GHz CMOS Pico-Joule/Bit Oook Receiver Design for Multi-Gigabit Per Second Wireless Communications" thesis paper, Aug. 2008, 52 pages.

(Continued)

*Primary Examiner* — Alejandro Rivero
(74) *Attorney, Agent, or Firm* — Fenwick & West LLP

(57) ABSTRACT

A first electronic device may include a first electronic circuit and a second electronic circuit. The first electronic device may include an internal communication link providing a signal path for conducting communication signals between the first electronic circuit and the second electronic circuit. An interface circuit may be operatively coupled to the internal communication link. The interface circuit may include an extremely high frequency (EHF) communications circuit configured to receive an EHF electromagnetic signal from another EHF communications circuit of a second electronic device. This EHF electromagnetic signal may enable the second electronic device to control or monitor the first electronic device.

12 Claims, 8 Drawing Sheets

(56) References Cited

U.S. PATENT DOCUMENTS

| | | |
|---|---|---|
| 4,800,350 A | 1/1989 | Bridges et al. |
| 4,875,026 A | 10/1989 | Walter et al. |
| 4,946,237 A | 8/1990 | Arroyo et al. |
| 5,164,942 A | 11/1992 | Kamerman et al. |
| 5,199,086 A | 3/1993 | Johnson et al. |
| 5,471,668 A | 11/1995 | Soenen et al. |
| 5,543,808 A | 8/1996 | Feigenbaum et al. |
| 5,621,913 A | 4/1997 | Tuttle et al. |
| 5,749,052 A | 5/1998 | Hidem et al. |
| 5,754,948 A | 5/1998 | Metze |
| 5,773,878 A | 6/1998 | Lim et al. |
| 5,786,626 A | 7/1998 | Brady et al. |
| 5,861,782 A | 1/1999 | Saitoh |
| 5,921,783 A | 7/1999 | Fritsch et al. |
| 5,941,729 A | 8/1999 | Sri-Jayantha |
| 5,943,374 A | 8/1999 | Kokuryo et al. |
| 5,956,626 A | 9/1999 | Kaschke et al. |
| 6,011,785 A | 1/2000 | Carney |
| 6,072,433 A | 6/2000 | Young et al. |
| 6,252,767 B1 | 6/2001 | Carlson |
| 6,351,237 B1 | 2/2002 | Martek et al. |
| 6,373,447 B1 | 4/2002 | Rostoker et al. |
| 6,490,443 B1 | 12/2002 | Freeny, Jr. |
| 6,492,973 B1 | 12/2002 | Araki et al. |
| 6,534,784 B2 | 3/2003 | Eliasson et al. |
| 6,542,720 B1 | 4/2003 | Tandy |
| 6,590,544 B1 | 7/2003 | Filipovic |
| 6,607,136 B1 | 8/2003 | Atsmon et al. |
| 6,647,246 B1 | 11/2003 | Lu |
| 6,718,163 B2 | 4/2004 | Tandy |
| 6,768,770 B1 | 7/2004 | Lipperer |
| 6,803,841 B2 | 10/2004 | Saitoh et al. |
| 6,915,529 B1 | 7/2005 | Suematsu et al. |
| 6,967,347 B2 | 11/2005 | Estes et al. |
| 7,050,763 B2 | 5/2006 | Stengel et al. |
| 7,107,019 B2 | 9/2006 | Tandy |
| 7,113,087 B1 | 9/2006 | Casebolt et al. |
| 7,213,766 B2 | 5/2007 | Ryan et al. |
| 7,311,526 B2 | 12/2007 | Rohrbach et al. |
| 7,512,395 B2 | 3/2009 | Beukema et al. |
| 7,517,222 B2 | 4/2009 | Rohrbach et al. |
| 7,593,708 B2 | 9/2009 | Tandy |
| 7,598,923 B2 | 10/2009 | Hardacker et al. |
| 7,599,427 B2 | 10/2009 | Bik |
| 7,612,630 B2 | 11/2009 | Miller |
| 7,617,342 B2 | 11/2009 | Rofougaran |
| 7,645,143 B2 | 1/2010 | Rohrbach et al. |
| 7,656,205 B2 | 2/2010 | Chen et al. |
| 7,664,461 B2 | 2/2010 | Rofougaran et al. |
| 7,760,045 B2 | 7/2010 | Kawasaki |
| 7,761,092 B2 | 7/2010 | Desch et al. |
| 7,768,457 B2 | 8/2010 | Pettus et al. |
| 7,769,347 B2 | 8/2010 | Louberg et al. |
| 7,778,621 B2 | 8/2010 | Tandy |
| 7,791,167 B1 | 9/2010 | Rofougaran |
| 7,820,990 B2 | 10/2010 | Schroeder et al. |
| 7,881,675 B1 | 2/2011 | Gazdzinski |
| 7,881,753 B2 | 2/2011 | Rofougaran |
| 7,889,022 B2 | 2/2011 | Miller |
| 7,907,924 B2 | 3/2011 | Kawasaki |
| 7,929,474 B2 | 4/2011 | Pettus et al. |
| 7,975,079 B2 | 7/2011 | Bennett et al. |
| 8,013,610 B1 | 9/2011 | Merewether et al. |
| 8,014,416 B2 | 9/2011 | Ho et al. |
| 8,023,886 B2 | 9/2011 | Rofougaran |
| 8,036,629 B2 | 10/2011 | Tandy |
| 8,041,227 B2 | 10/2011 | Holcombe et al. |
| 8,063,769 B2 | 11/2011 | Rofougaran |
| 8,081,699 B2 | 12/2011 | Siwiak et al. |
| 8,087,939 B2 | 1/2012 | Rohrbach et al. |
| 8,121,542 B2 | 2/2012 | Zack et al. |
| 8,131,645 B2 | 3/2012 | Lin et al. |
| 8,183,935 B2 | 5/2012 | Milano et al. |
| 8,244,175 B2 | 8/2012 | Rofougaran |
| 8,244,179 B2 | 8/2012 | Dua |
| 8,279,611 B2 | 10/2012 | Wong et al. |
| 8,339,258 B2 | 12/2012 | Rofougaran |
| 8,346,847 B2 | 1/2013 | Steakley |
| 8,422,482 B2 | 4/2013 | Sugita |
| 8,554,136 B2 | 10/2013 | McCormack |
| 8,634,767 B2 | 1/2014 | Rofougaran et al. |
| 8,755,849 B2 | 6/2014 | Rofougaran et al. |
| 8,794,980 B2 | 8/2014 | McCormack |
| 8,939,773 B2 | 1/2015 | McCormack |
| 2002/0008665 A1 | 1/2002 | Takenoshita |
| 2002/0027481 A1 | 3/2002 | Fiedziuszko |
| 2002/0058484 A1 | 5/2002 | Bobier et al. |
| 2002/0106041 A1 | 8/2002 | Chang et al. |
| 2002/0118083 A1 | 8/2002 | Pergande |
| 2002/0140584 A1 | 10/2002 | Maeda et al. |
| 2003/0025626 A1 | 2/2003 | McEwan |
| 2003/0088404 A1 | 5/2003 | Koyanagi |
| 2003/0137371 A1 | 7/2003 | Saitoh et al. |
| 2004/0043734 A1 | 3/2004 | Hashidate |
| 2004/0160294 A1 | 8/2004 | Elco |
| 2004/0214621 A1 | 10/2004 | Ponce De Leon et al. |
| 2005/0032474 A1 | 2/2005 | Gordon |
| 2005/0099242 A1 | 5/2005 | Sano |
| 2005/0109841 A1 | 5/2005 | Ryan et al. |
| 2005/0124307 A1 | 6/2005 | Ammar |
| 2005/0140436 A1 | 6/2005 | Ichitsubo et al. |
| 2006/0003710 A1 | 1/2006 | Nakagawa et al. |
| 2006/0029229 A1 | 2/2006 | Trifonov et al. |
| 2006/0038168 A1 | 2/2006 | Estes et al. |
| 2006/0051981 A1 | 3/2006 | Neidlein et al. |
| 2006/0077043 A1 | 4/2006 | Amtmann et al. |
| 2006/0082518 A1 | 4/2006 | Ram |
| 2006/0128372 A1 | 6/2006 | Gazzola |
| 2006/0140305 A1 | 6/2006 | Netsell et al. |
| 2006/0159158 A1 | 7/2006 | Moore et al. |
| 2006/0258289 A1 | 11/2006 | Dua |
| 2006/0276157 A1* | 12/2006 | Chen et al. ............... 455/333 |
| 2007/0010295 A1 | 1/2007 | Greene |
| 2007/0024504 A1 | 2/2007 | Matsunaga |
| 2007/0035917 A1 | 2/2007 | Hotelling et al. |
| 2007/0063056 A1 | 3/2007 | Gaucher et al. |
| 2007/0147425 A1 | 6/2007 | Lamoureux et al. |
| 2007/0229270 A1 | 10/2007 | Rofougaran |
| 2007/0242621 A1 | 10/2007 | Nandagopalan et al. |
| 2007/0273476 A1 | 11/2007 | Yamazaki et al. |
| 2007/0278632 A1 | 12/2007 | Zhao et al. |
| 2008/0002652 A1 | 1/2008 | Gupta et al. |
| 2008/0055093 A1 | 3/2008 | Shkolnikov et al. |
| 2008/0055303 A1 | 3/2008 | Ikeda |
| 2008/0089667 A1 | 4/2008 | Grady et al. |
| 2008/0112101 A1 | 5/2008 | McElwee et al. |
| 2008/0142250 A1 | 6/2008 | Tang |
| 2008/0143435 A1 | 6/2008 | Wilson et al. |
| 2008/0150799 A1 | 6/2008 | Hemmi et al. |
| 2008/0150821 A1 | 6/2008 | Koch et al. |
| 2008/0159243 A1 | 7/2008 | Rofougaran |
| 2008/0165002 A1 | 7/2008 | Tsuji |
| 2008/0165065 A1 | 7/2008 | Hill et al. |
| 2008/0192726 A1 | 8/2008 | Mahesh et al. |
| 2008/0195788 A1 | 8/2008 | Tamir et al. |
| 2008/0197973 A1 | 8/2008 | Enguent |
| 2008/0238632 A1 | 10/2008 | Endo et al. |
| 2008/0289426 A1 | 11/2008 | Kearns et al. |
| 2008/0290959 A1 | 11/2008 | Ali et al. |
| 2008/0293446 A1 | 11/2008 | Rofougaran |
| 2009/0006677 A1 | 1/2009 | Rofougaran |
| 2009/0009337 A1 | 1/2009 | Rofougaran |
| 2009/0015353 A1 | 1/2009 | Rofougaran |
| 2009/0028177 A1 | 1/2009 | Pettus et al. |
| 2009/0029659 A1 | 1/2009 | Gonzalez |
| 2009/0033455 A1 | 2/2009 | Strat et al. |
| 2009/0037628 A1* | 2/2009 | Rofougaran ............... 710/106 |
| 2009/0073070 A1 | 3/2009 | Rofougaran |
| 2009/0075688 A1 | 3/2009 | Rofougaran |
| 2009/0086844 A1 | 4/2009 | Rofougaran |
| 2009/0091486 A1 | 4/2009 | Wiesbauer et al. |
| 2009/0094506 A1 | 4/2009 | Lakkis |
| 2009/0098826 A1 | 4/2009 | Zack et al. |
| 2009/0110131 A1 | 4/2009 | Bornhoft et al. |

(56) References Cited

U.S. PATENT DOCUMENTS

| | | |
|---|---|---|
| 2009/0111390 A1 | 4/2009 | Sutton et al. |
| 2009/0175323 A1 | 7/2009 | Chung |
| 2009/0180408 A1 | 7/2009 | Graybeal et al. |
| 2009/0218407 A1 | 9/2009 | Rofougaran |
| 2009/0218701 A1 | 9/2009 | Rofougaran |
| 2009/0236701 A1 | 9/2009 | Sun et al. |
| 2009/0237317 A1 | 9/2009 | Rofougaran |
| 2009/0239392 A1 | 9/2009 | Sumitomo et al. |
| 2009/0239483 A1 | 9/2009 | Rofougaran |
| 2009/0245808 A1 | 10/2009 | Rofougaran |
| 2009/0257445 A1 | 10/2009 | Chan et al. |
| 2009/0280765 A1 | 11/2009 | Rofougaran et al. |
| 2009/0310649 A1 | 12/2009 | Fisher et al. |
| 2010/0009627 A1 | 1/2010 | Huomo |
| 2010/0103045 A1 | 4/2010 | Liu et al. |
| 2010/0120406 A1 | 5/2010 | Banga et al. |
| 2010/0127804 A1 | 5/2010 | Vouloumanos |
| 2010/0149149 A1 | 6/2010 | Lawther |
| 2010/0159829 A1 | 6/2010 | McCormack |
| 2010/0167645 A1 | 7/2010 | Kawashimo |
| 2010/0202345 A1 | 8/2010 | Jing et al. |
| 2010/0202499 A1 | 8/2010 | Lee et al. |
| 2010/0203833 A1 | 8/2010 | Dorsey |
| 2010/0231452 A1 | 9/2010 | Babakhani et al. |
| 2010/0260274 A1 | 10/2010 | Yamada et al. |
| 2010/0265648 A1 | 10/2010 | Hirabayashi |
| 2010/0277394 A1 | 11/2010 | Haustein et al. |
| 2010/0282849 A1 | 11/2010 | Mair |
| 2010/0283700 A1 | 11/2010 | Rajanish et al. |
| 2010/0285634 A1 | 11/2010 | Rofougaran |
| 2010/0297954 A1 | 11/2010 | Rofougaran et al. |
| 2010/0315954 A1 | 12/2010 | Singh et al. |
| 2011/0009078 A1 | 1/2011 | Kawamura |
| 2011/0038282 A1 | 2/2011 | Mihota et al. |
| 2011/0044404 A1 | 2/2011 | Vromans |
| 2011/0047588 A1 | 2/2011 | Takeuchi et al. |
| 2011/0050446 A1 | 3/2011 | Anderson et al. |
| 2011/0084398 A1 | 4/2011 | Pilard et al. |
| 2011/0092212 A1 | 4/2011 | Kubota |
| 2011/0122932 A1 | 5/2011 | Lovberg |
| 2011/0127954 A1 | 6/2011 | Walley et al. |
| 2011/0181484 A1 | 7/2011 | Pettus et al. |
| 2011/0197237 A1 | 8/2011 | Turner |
| 2011/0207425 A1 | 8/2011 | Juntunen et al. |
| 2011/0221582 A1 | 9/2011 | Chuey et al. |
| 2011/0250928 A1 | 10/2011 | Schlub et al. |
| 2011/0285606 A1 | 11/2011 | De Graauw et al. |
| 2011/0286703 A1 | 11/2011 | Kishima et al. |
| 2011/0292972 A1 | 12/2011 | Budianu et al. |
| 2011/0311231 A1 | 12/2011 | Ridgway et al. |
| 2012/0009880 A1 | 1/2012 | Trainin et al. |
| 2012/0013499 A1 | 1/2012 | Hayata |
| 2012/0028582 A1 | 2/2012 | Tandy |
| 2012/0064664 A1 | 3/2012 | Yamazaki et al. |
| 2012/0069772 A1 | 3/2012 | Byrne et al. |
| 2012/0072620 A1 | 3/2012 | Jeong et al. |
| 2012/0082194 A1 | 4/2012 | Tam et al. |
| 2012/0083137 A1 | 4/2012 | Rohrbach et al. |
| 2012/0091799 A1 | 4/2012 | Rofougaran et al. |
| 2012/0110635 A1 | 5/2012 | Harvey et al. |
| 2012/0126794 A1 | 5/2012 | Jensen et al. |
| 2012/0139768 A1 | 6/2012 | Loeda et al. |
| 2012/0219039 A1 | 8/2012 | Feher |
| 2012/0249366 A1 | 10/2012 | Pozgay et al. |
| 2012/0263244 A1 | 10/2012 | Kyles et al. |
| 2012/0265596 A1 | 10/2012 | Mazed et al. |
| 2012/0286049 A1 | 11/2012 | McCormack et al. |
| 2012/0290760 A1 | 11/2012 | McCormack et al. |
| 2012/0295539 A1 | 11/2012 | McCormack et al. |
| 2012/0307932 A1 | 12/2012 | McCormack et al. |
| 2012/0319496 A1 | 12/2012 | McCormack et al. |
| 2012/0319890 A1 | 12/2012 | McCormack et al. |
| 2013/0070817 A1 | 3/2013 | McCormack et al. |
| 2013/0106673 A1 | 5/2013 | McCormack et al. |
| 2013/0109303 A1 | 5/2013 | McCormack et al. |
| 2013/0157477 A1 | 6/2013 | McCormack |
| 2013/0183903 A1 | 7/2013 | McCormack et al. |
| 2013/0196598 A1 | 8/2013 | McCormack et al. |
| 2013/0257670 A1 | 10/2013 | Sovero et al. |
| 2013/0278360 A1 | 10/2013 | Kim et al. |
| 2013/0316653 A1 | 11/2013 | Kyles et al. |
| 2014/0038521 A1 | 2/2014 | McCormack |
| 2014/0043208 A1 | 2/2014 | Mccormack et al. |
| 2014/0266331 A1 | 9/2014 | Arora |
| 2015/0111496 A1 | 4/2015 | Mccormack et al. |

FOREIGN PATENT DOCUMENTS

| | | |
|---|---|---|
| CN | 2313296 Y | 4/1999 |
| CN | 1781255 A | 5/2006 |
| CN | 101090179 A | 12/2007 |
| CN | 101496298 A | 7/2009 |
| CN | 201562854 U | 8/2010 |
| EP | 0152246 A2 | 8/1985 |
| EP | 0 515 187 A2 | 11/1992 |
| EP | 0515187 A2 | 11/1992 |
| EP | 0789421 A2 | 8/1997 |
| EP | 0884799 A2 | 12/1998 |
| EP | 0896380 A2 | 2/1999 |
| EP | 0996189 A2 | 4/2000 |
| EP | 1041666 A1 | 10/2000 |
| EP | 1 298 809 A2 | 4/2003 |
| EP | 1298809 A2 | 4/2003 |
| EP | 1357395 A1 | 10/2003 |
| EP | 1798867 A2 | 6/2007 |
| EP | 2106192 A2 | 9/2009 |
| EP | 2 309 608 A1 | 4/2011 |
| EP | 2309608 A1 | 4/2011 |
| EP | 2328226 A1 | 6/2011 |
| EP | 2 360 923 A1 | 8/2011 |
| EP | 2360923 A1 | 8/2011 |
| GB | 817349 | 7/1959 |
| GB | 2217114 | 10/1989 |
| JP | 52-72502 A | 6/1977 |
| JP | 5-236031 A | 9/1993 |
| JP | 5-327788 A | 12/1993 |
| JP | 07-006817 A | 1/1995 |
| JP | 9-83538 A | 3/1997 |
| JP | 10-13296 A | 1/1998 |
| JP | 2001-153963 A | 6/2001 |
| JP | 2001-326506 A | 11/2001 |
| JP | 2002-261514 A | 9/2002 |
| JP | 2002-265729 A | 9/2002 |
| JP | 2003-209511 A | 7/2003 |
| JP | 2003209511 A | 7/2003 |
| JP | 2004-505505 A | 2/2004 |
| JP | 2005-117153 A | 4/2005 |
| JP | 2008-079241 | 4/2008 |
| JP | 2008-129919 A | 6/2008 |
| JP | 2008-250713 A | 10/2008 |
| JP | 2008 252566 A | 10/2008 |
| JP | 2009-231114 | 7/2009 |
| JP | 2009-239842 A | 10/2009 |
| JP | 2010-183055 A | 8/2010 |
| JP | 2010-531035 A | 9/2010 |
| JP | 2011-022640 A | 2/2011 |
| JP | 2011-41078 A | 2/2011 |
| JP | 2014-516221 | 7/2014 |
| WO | 97/32413 | 9/1997 |
| WO | WO 97/32413 A | 9/1997 |
| WO | WO 2006/133108 A2 | 12/2006 |
| WO | WO 2009/113373 A1 | 9/2009 |
| WO | 2011/114737 A1 | 9/2011 |
| WO | 2011/114738 A1 | 9/2011 |
| WO | WO 2011/114737 A1 | 9/2011 |
| WO | WO 2011/114738 A1 | 9/2011 |
| WO | 2012/129426 A3 | 9/2012 |
| WO | WO 2012/129426 A3 | 9/2012 |
| WO | 2012/155135 A3 | 11/2012 |
| WO | WO 2012/154550 A1 | 11/2012 |
| WO | WO 2012/155135 A3 | 11/2012 |
| WO | 2012/166922 A1 | 12/2012 |
| WO | 2012/174350 A1 | 12/2012 |
| WO | WO 2012/166922 A1 | 12/2012 |

(56) References Cited

FOREIGN PATENT DOCUMENTS

| WO | WO 2012/174350 A1 | 12/2012 |
| --- | --- | --- |
| WO | 2013/006641 A3 | 1/2013 |
| WO | WO 2013/006641 A3 | 1/2013 |
| WO | 2013/040396 A1 | 3/2013 |
| WO | WO 2013/040396 A1 | 3/2013 |
| WO | 2013/059801 A1 | 4/2013 |
| WO | WO 2013/059801 A1 | 4/2013 |
| WO | WO 2013/059802 A1 | 4/2013 |
| WO | 2013/090625 A1 | 6/2013 |
| WO | WO 2013/090625 A1 | 6/2013 |
| WO | WO 2013/131095 A1 | 9/2013 |
| WO | WO 2013/134444 A1 | 9/2013 |
| WO | WO 2014/026191 A1 | 2/2014 |

OTHER PUBLICATIONS

Murcia Martinez, J., Authorized Officer, European Patent Office, "International Search Report" in connection with related Application Serial No. PCT/US2012/040214, dated Aug. 21, 2012, 3 pages.

Murcia Martinez, J., Authorized Officer, European Patent Office, "Written Opinion of the International Searching Authority" in connection with related Application Serial No. PCT/US2012/040214, dated Aug. 21, 2012, 8 pages.

Ablerga, Vito, Authorized Officer, European Patent Office, "International Search Report" in connection with related Application Serial No. PCT/US2012/042616 dated Oct. 1, 2012, 4 pages.

Ablerga, Vito, Authorized Officer, European Patent Office, "Written Opinion of the International Searching Authority" in connection with related Application Serial No. PCT/US2012/042616 dated Oct. 1, 2012, 10 pages.

Cortes Rosa, Joao, Authorized Officer, European Patent Office, "International Search Report" in connection with related Application No. PCT/US2012/030166, dated Oct. 31, 2010, 6 pages.

Cortes Rosa, Joao, Authorized Officer, European Patent Office, "Written Opinion of the International Searching Authority" in connection with related Application No. PCT/US2012/030166, dated Oct. 31, 2010, 9 pages.

Helms, Jochen, Authorized Officer, European Patent Office, "International Search Report" in connection with related Application No. PCT/US2012/055488, dated Dec. 13, 2012, 4 pages.

Helms, Jochen, Authorized Officer, European Patent Office, "Written Opinion of the International Searching Authority" in connection with related Application No. PCT/US2012/055488, dated Dec. 13, 2012, 8 pages.

Helms, Jochen, Authorized Officer, European Patent Office, "International Search Report" in connection with related Application No. PCT/US2012/045444, dated Jan. 21, 2013, 7 pages.

Helms, Jochen, Authorized Officer, European Patent Office, "Written Opinion of the International Searching Authority" in connection with related Application No. PCT/US2012/045444, dated Jan. 21, 2013, 9 pages.

Helms, Jochen, Authorized Officer, European Patent Office, "International Search Report" in connection with related Application No. PCT/US2012/037795, dated Jan. 21, 2013, 7 pages.

Helms, Jochen, Authorized Officer, European Patent Office, "Written Opinion of the International Searching Authority" in connection with related Application No. PCT/US2012/037795, dated Jan. 21, 2013, 12 pages.

Helms, Jochen, Authorized Officer, European Patent Office, "International Search Report" in connection with related Application No. PCT/US2012/061345, dated Jan. 24, 2013, 4 pages.

Helms, Jochen, Authorized Officer, European Patent Office, "Written Opinion of the International Searching Authority" in connection with related Application No. PCT/US2012/061345, dated Jan. 24, 2013, 7 pages.

Franz, Volker, Authorized Officer, European Patent Office, "International Search Report" in connection with related Application No. PCT/US2012/061346, dated Jan. 24, 2013, 5 pages.

Franz, Volker, Authorized Officer, European Patent Office, "Written Opinion of the International Searching Authority" in connection with related Application No. PCT/US2012/061346, dated Jan. 24, 2013, 9 pages.

Bouhana, Emmanuel, Authorized Officer, European Patent Office, "International Search Report" in connection with related Application No. PCT/US2012/069576, dated May 2, 2013, 3 pages.

Bouhana, Emmanuel, Authorized Officer, European Patent Office, "Written Opinion of the International Searching Authority" in connection with related Application No. PCT/US2012/069576, dated May 2, 2013, 13 pages.

L. L. Goldstone, "MM Wave Transmission Polarizer", International Symposium Digest—Antennas & Propagation vol. 2, Jun. 1979, 5 pages.

ECMA International, "Standard ECMA—398: Close Proximity Electric Induction Wireless Communications", Internet citation, Jun. 1, 2011, pp. 1-99.

Future Technology Devices International Limited (FTDI), "Technical Note TN_113 Simplified Description of USB Device Enumeration", Doc. Ref. No. FT_000180, Version 1.0, Issue Date Oct. 28, 2009, 19 pages.

Lee W. Young, Authorized Officer, U.S. Patent and Trademark Office, "International Search Report" in connection with related PCT Patent App. No. PCT/US2013/027835, dated May 3, 2013, 4 pages.

Lee W. Young, Authorized Officer, U.S. Patent and Trademark Office, "Written Opinion of the International Searching Authority" in connection with related PCT Patent App. No. PCT/US2013/027835, dated May 3, 2013, 8 pages.

Márquez, T. López, Authorized Officer, European Patent Office, "International Search Report" in connection with related PCT Patent App. No. PCT/US2013/029469, dated Jun. 6, 2013, 5 pages.

Márquez, T. López, Authorized Officer, European Patent Office, "Written Opinion of the International Searching Authority" in connection with related PCT Patent App. No. PCT/US2013/029469, dated Jun. 6, 2013, 5 pages.

Jochen Helms, Authorized Officer, European Patent Office, "International Search Report" in connection with related PCT Patent App. No. PCT/US2013/023665, dated Jun. 20, 2013, 5 pages.

Jochen Helms, Authorized Officer, European Patent Office, "Written Opinion of the International Searching Authority" in connection with related PCT Patent App. No. PCT/US2013/023665, dated Jun. 20, 2013, 10 pages.

Bluetooth Audio Dongle Receiver 3.5mm Stereo, Feb. 8, 2013.

Bluetooth Headset, Jabra clipper, Jul. 28, 2010.

Chinese Office Action, Chinese Application No. 201280025060.8, Oct. 30, 2014, 8 pages (with concise explanation of relevance).

ECMA Standard: "Standard ECMA-398: Close Proximity Electric Induction Wireless Communications," Jun. 1, 2011, pp. 1-100, May be retrieved from the Internet<URL:http://www.ecma-international.org/publications/standards/Ecma398.htm>.

Enumeration: How the Host Learns about Devices, Jan Axelson's Lakeview Research.

Future Technology Devices Interntional Limited (FTDI) "Technical Note TN_I 13 Simplified Description of USB Device Enumeration", Doc. Ref. No. FT_000180, Version 1.0, Issue Date Oct. 28, 2009, 19 pages.

Goldstone, L. L., "MM Wave Transmission Polarizer", International Symposium Digest—Antennas & Propagation vol. 2, Jun. 1979, 5 pages.

Japanese Office Action, Japanese Patent Office, "Notice of Reasons for Rejection" in connection with related Japanese Patent Application No. 2014-501249, dated Jul. 22, 2014, 7 pages.

Japanese Office Action, Japanese Application No. 2014-513697, Jan. 20, 2015, 7 pages.

Juntunen, E. A., "60 GHz CMOS Pico-Joule/Bit Oook Receiver Design for Multi-Gigabit Per Second Wireless Communications" thesis paper, Aug. 2008, 52 pages.

Korean Office Action, Korean Application No. 10-2013-7027865, Oct. 22, 2014, 12 pages.

Office of Engineering and Technology Federal Communications Commission, "Understanding the FCC Regulations for Low-Power, Non-Licensed Transmitters", OET Bulletin No. 63, Oct. 1993, 34 pages.

(56) References Cited

OTHER PUBLICATIONS

PCM510x 2VRMS DirectPath™, 112/106/l00dB Audio Stereo DAC with 32-bit, 384kHz PCM Interface by Texas Instruments.
PCT International Search Report, PCT Patent Application No. PCT/US2013/027835, dated May 3, 2013, 4 pages.
PCT Written Opinion, PCT Patent Application No. PCT/US2013/027835, May 3, 2013, 8 pages.
PCT International Search Report, PCT Patent Application No. PCT/US2013/029469, Jun. 6, 2013, 5 pages.
PCT Written Opinion, PCT Patent Application No. PCT/US2013/029469, Jun. 6, 2013, 5 pages.
PCT International Search Report, PCT Patent Application No. PCT/US2013/023665, Jun. 20, 2013, 5 pages.
PCT Written Opinion, PCT Patent Application No. PCT/US2013/023665, Jun. 20, 2013, 10 pages.
PCT International Search Report, PCT Patent Application No. PCT/US2012/040214, Aug. 21, 2012, 3 pages.
PCT Written Opinion, PCT Patent Application No. PCT/US2012/040214, Aug. 21, 2012, 8 pages.
PCT International Search Report, PCT Patent Application No. PCT/US2012/042616, Oct. 1, 2012, 4 pages.
PCT Written Opinion, PCT Patent Application No. PCT/US2012/042616, Oct. 1, 2012, 10 pages.
PCT International Search Report, PCT Patent Application No. PCT/US2012/030166, Oct. 31, 2010, 6 pages.
PCT Written Opinion, PCT Patent Application No. PCT/US2012/030166, Oct. 31, 2010, 9 pages.
PCT International Search Report, PCT Patent Application No. PCT/US2012/055488, Dec. 13, 2012, 4 pages.
PCT Written Opinion, PCT Patent Application No. PCT/US2012/055488, Dec. 13, 2012, 8 pages.
PCT International Search Report, PCT Patent Application No. PCT/US2012/045444, Jan. 21, 2013, 7 pages.
PCT Written Opinion, PCT Patent Application No. PCT/US2012/045444, Jan. 21, 2013, 9 pages.
PCT International Search Report, PCT Patent Application No. PCT/US2012/037795, Jan. 21, 2013, 7 pages.
PCT Written Opinion, PCT Patent Application No. PCT/US2012/037795, Jan. 21, 2013, 12 pages.
PCT International Search Report, PCT Patent Application No. PCT/US2012/061345, Jan. 24, 2013, 4 pages.
PCT Written Opinion, PCT Patent Application No. PCT/US2012/061345, Jan. 24, 2013, 7 pages.
PCT International Search Report, PCT Patent Application No. PCT/US2012/061346, Jan. 24, 2013, 5 pages.
PCT Written Opinion, PCT Patent Application No. PCT/US2012/061346, Jan. 24, 2013, 9 pages.
PCT International Search Report, PCT Patent Application No. PCT/US2012/069576, May 2, 2013, 3 pages.
PCT Written Opinion, PCT Patent Application No. PCT/US2012/069576, May 2, 2013, 13 pages.
PCT International Search Report, PCT Patent Application No. PCT/US2013/028896, Sep. 26, 2013, 4 pages.
PCT Written Opinion, PCT Patent Application No. PCT/US2013/028896, Sep. 26, 2013, 4 pages.
PCT International Search Report, PCT Patent Application No. PCT/US2013/046631, Sep. 20, 2013, 4 pages.
PCT Written Opinion, PCT Patent Application No. PCT/US2013/046631, Sep. 20, 2013, 6 pages.
PCT International Search Report, PCT Patent Application No. PCT/US2013/054292, Nov. 29, 2013, 4 pages.
PCT Written Opinion, PCT Patent Application No. PCT/US2013/054292, Nov. 29, 2013, 7 pages.
PCT International Search Report and Written Opinion, PCT Application No. PCT/US2014/024027, Jul. 21, 2014, 15 pages.
PCT International Search Report, PCT Application No. PCT/US2013/075222, Jul. 17, 2014, 4 pages.
PCT Written Opinion, PCT Application No. PCT/US2013/075222, Jul. 17, 2014, 8 pages.
PCT International Search Report, PCT Application No. PCT/US2013/075892, Apr. 23, 2014, 4 pages.
PCT Written Opinion, PCT Application No. PCT/US2013/075892, Apr. 23, 2014, 8 pages.
PCT International Search Report and Written Opinion, PCT Application No. PCT/US2013/033394, Aug. 8, 2013, 10 pages.
PCT International Search Report and Written Opinion, PCT Application No. PCT/US2013/055487, Jan. 24, 2014, 9 pages.
PCT International Search Report and Written Opinion, PCT Application No. PCT/US2013/076687, May 21, 2014, 20 pages.
PCT International Search Report and Written Opinion, PCT Application No. PCT/US2014/030115, Sep. 22, 2014, 15 pages.
PCT International Search Report and Written Opinion, PCT Application No. PCT/U52013/059811, Dec. 2, 2013, 11 pages.
Philips, I2S Bus Specification, Jun. 5, 1996.
RF Power Amplifier, Mar. 22, 2008, 1 page, May be Retrieved at <http://en.wikipedia.org/wiki/RF_power_amplifier>.
Silicon Labs USB-to-12S Audio Bridge Chip Brings Plug-and-Play Simplicity to Audio Design, Cision Wire, Feb. 4, 2013.
TN21065L_I2S, Interfacing I2S-Compatible Audio Devices to the ADSP-21065L Serial Ports, Apr. 1999.
USB in a NutShell . . . (43 pages).
USB Made Simple, MQP Electronics Ltd, 2006-2008 (78 pages).
"Understanding the FCC Regulations for Low-Power Non-Licensed Transmitters", Office of Engineering and Technology, Federal Communications Commission, OET Bulletin No. 63, Oct. 1993.
Universal Serial Bus, Wikipedia, 2012 (32 pages).
Vahle Electrification Systems, "CPS Contactless Power System", Catalog No. 9d/E, 2004, 12 pages.
Wireless HD: "WirelessHD Specification Version 1.1 Overview," May 1, 2010, pp. 1-95, May be retrieved from the Internet<URL:http://www.wirelesshd.org/pdfs/WirelessHD-Specification-Overview-v1.1May2010.pdf>.
United States Office Action, U.S. Appl. No. 13/485,306, Sep. 26, 2013, 11 pages.
United States Office Action, U.S. Appl. No. 13/541,543, Feb. 12, 2015, 25 pages.
United States Office Action, U.S. Appl. No. 13/541,543, Oct. 28, 2014, 42 pages.
United States Office Action, U.S. Appl. No. 13/427,576, Oct. 30, 2014, 6 pages.
United States Office Action, U.S. Appl. No. 13/524,956, Feb. 9, 2015, 17 pages.
United States Office Action, U.S. Appl. No. 13/524,963, Mar. 17, 2014, 14 pages.
United States Office Action, U.S. Appl. No. 12/655,041, Jun. 7, 2013, 9 pages.
United States Office Action, U.S. Appl. No. 14/047,924, Dec. 19, 2014, 8 pages.
United States Office Action, U.S. Appl. No. 14/047,924, Feb. 27, 2014, 9 pages.
United States Office Action, U.S. Appl. No. 13/784,396, Sep. 11, 2014, 7 pages.
United States Office Action, U.S. Appl. No. 13/760,089, Jul. 7, 2014, 14 pages.
United States Office Action, U.S. Appl. No. 14/596,172, Feb. 10, 2015, 7 pages.
United States Office Action, U.S. Appl. No. 14/462,560, Feb. 13, 2015, 12 pages.
United States Office Action, U.S. Appl. No. 14/026,913, Feb. 25, 2015, 15 pages.
Japanese Office Action, Japanese Application No. 2014-519270, Mar. 9, 2015, 17 pages.
Korean Office Action, Korean Application No. 10-2013-7027865, Apr. 13, 2015, 8 pages.
Li, X. et al., "Space-Time Transmissions for Wireless Secret-Key Agreement with Information-Theoretic Secrecy," IEEE, 2003, pp. 1-5.
United States Office Action, U.S. Appl. No. 14/135,458, Apr. 13, 2015, 13 pages.
United States Office Action, U.S. Appl. No. 13/541,543, May 28, 2015, 17 pages.

(56) References Cited

OTHER PUBLICATIONS

United States Office Action, U.S. Appl. No. 14/047,924, May 21, 2015, 6 pages.
Chinese Second Office Action, Chinese Application No. 201280025060.8, Jun. 11, 2015, 8 pages.
Japanese Office Action, Japanese Application No. 2014-547442, May 25, 2015, 7 pages.
United States Office Action, U.S. Appl. No. 14/026,913, Jun. 5, 2015, 16 pages.
United States Office Action, U.S. Appl. No. 13/922,062, Jul. 23, 2015, 10 pages.
Japanese Office Action, Japanese Application No. 2015-004839, Aug. 10, 2015, 12 pages.
United States Office Action, U.S. Appl. No. 13/963,199, Jul. 27, 2015, 9 pages.
United States Office Action, U.S. Appl. No. 14/109,938, Aug. 14, 2015, 12 pages.
Chinese First Office Action, Chinese Application 201280043190.4, Jan. 21, 2015, 18 pages.
Chinese Second Office Action, Chinese Application 201280043190.4, Oct. 26, 2015, 5 pages.
European Examination Report, European Application No. 13711499.7, Oct. 5, 2015, 8 pages.
Japanese Office Action, Japanese Application No. 2014-513697, Nov. 2, 2015, 5 pages.
United States Office Action, U.S. Appl. No. 14/026,913, Sep. 18, 2015, 9 pages.
United States Office Action, U.S. Appl. No. 14/215,069, Oct. 30, 2015, 15 pages.
United States Office Action, U.S. Appl. No. 14/047,924, Nov. 18, 2015, 7 pages.
United States Office Action, U.S. Appl. No. 14/881,901, Dec. 17, 2015, 15 pages.
United States Office Action, U.S. Appl. No. 13/541,543, Dec. 21, 2015, 20 pages.
Chinese First Office Action, Chinese Application No. 201280038180.1, Dec. 1, 2015, 16 pages.
Chinese Third Office Action, Chinese Application No. 201280025060.8, Dec. 28, 2015, 6 pages.
Chinese First Office Action, Chinese Application No. 201280062118.6, Jan. 5, 2016, 15 pages.
Chinese First Office Action, Chinese Application No. 201380055859.6, Jan. 20, 2016, 5 pages
Chinese First Office Action, Chinese Application No. 201380048407.5, Feb. 3, 2016, 14 pages.

* cited by examiner

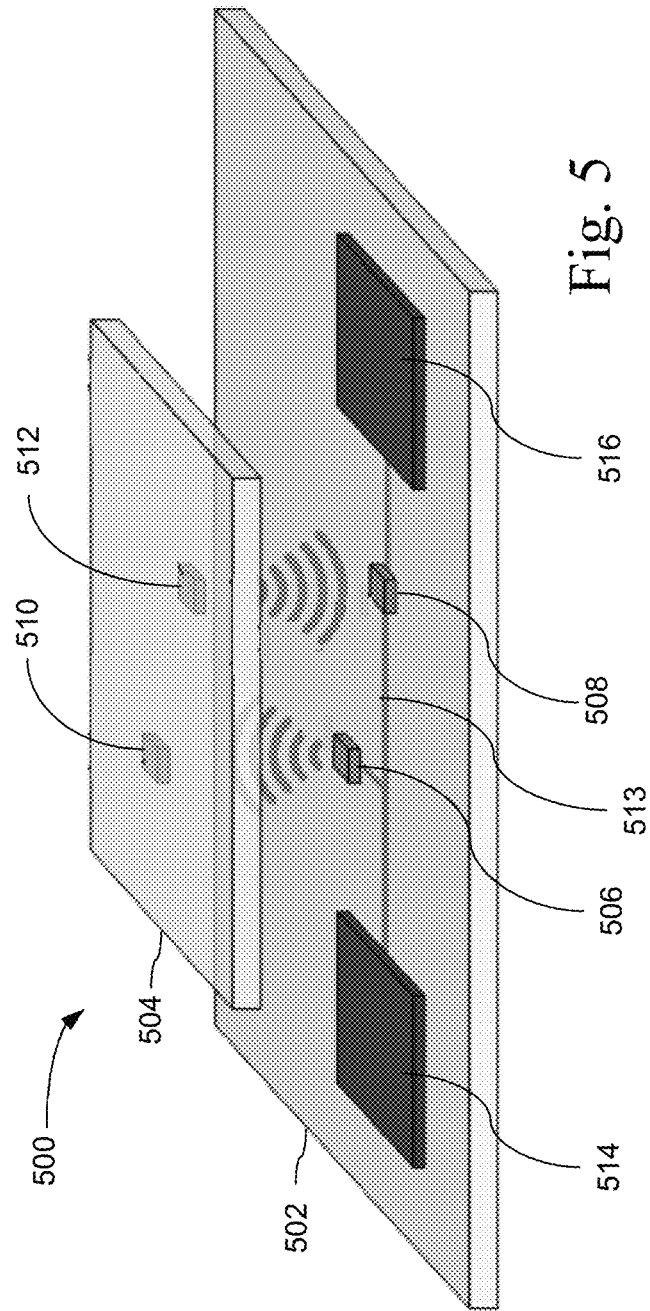

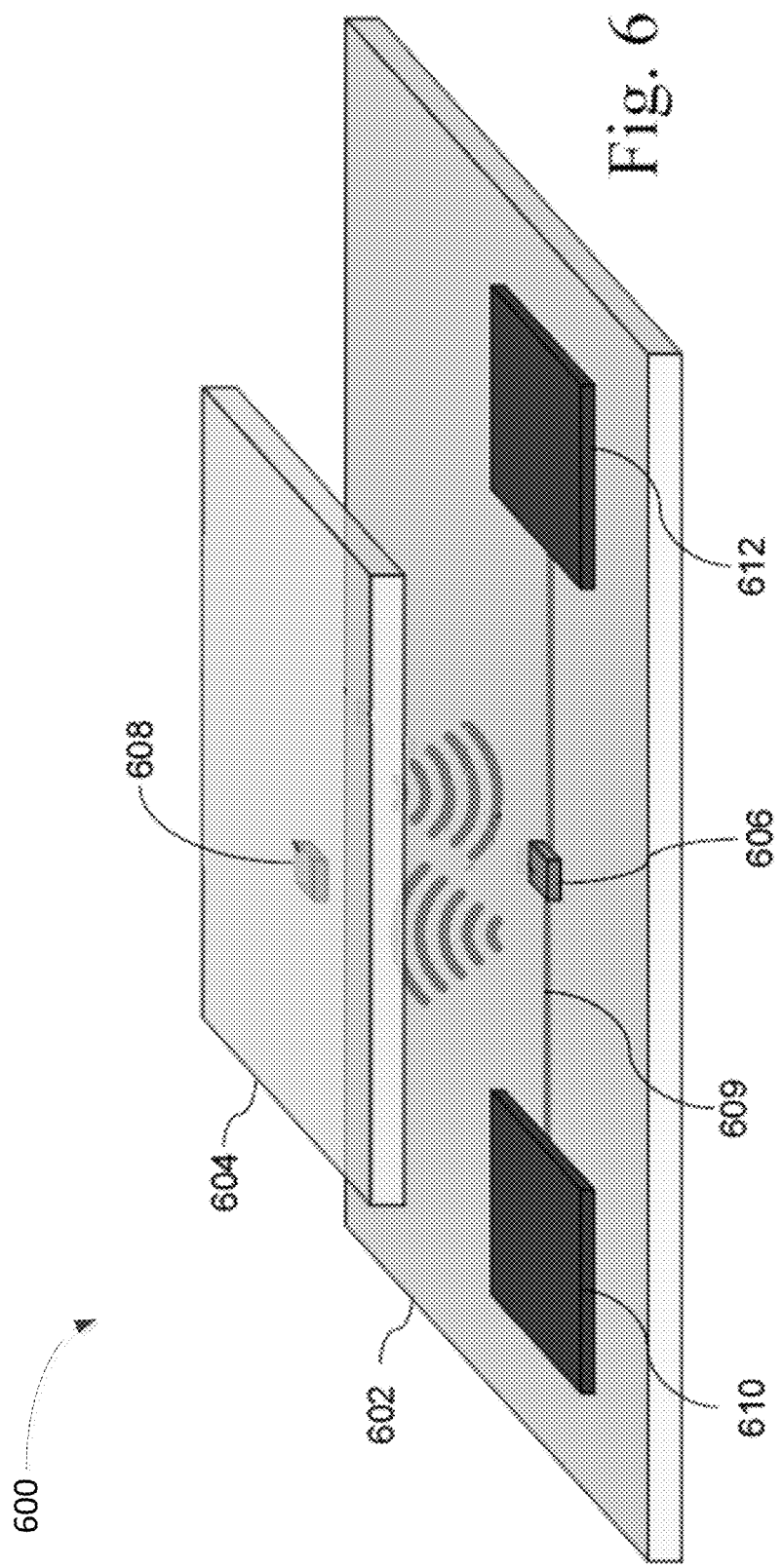

CONTACTLESS SIGNAL SPLICING USING AN EXTREMELY HIGH FREQUENCY (EHF) COMMUNICATION LINK

CROSS-REFERENCE TO RELATED APPLICATION

This application claims the benefit of the U.S. Provisional Patent Application having Ser. No. 61/550,274, filed on Oct. 21, 2011, and entitled "Contactless Signal Splicing", which is incorporated herein by reference in its entirety for all purposes.

TECHNICAL FIELD

The disclosure relates to data transfer using Extremely High Frequency (EHF) communications devices. More particularly, the disclosure relates to contactless monitoring or other control of a first device by a second device using EHF communication.

BACKGROUND

Advances in semiconductor manufacturing and circuit design technologies have enabled the development and production of integrated circuits (ICs) with increasingly higher operational frequencies. In turn, electronic products and systems incorporating such integrated circuits are able to provide much greater functionality than previous generations of products. This additional functionality has generally included the processing of increasingly larger amounts of data at increasingly higher speeds.

Many electronic systems include multiple printed circuit boards (PCBs) upon which these high-speed ICs are mounted, and through which various signals are routed to and from the ICs. In electronic systems with at least two PCBs and the need to communicate information between those PCBs, a variety of connector and backplane architectures have been developed to facilitate information flow between the boards. Unfortunately, such connector and backplane architectures introduce a variety of impedance discontinuities into the signal path, resulting in a degradation of signal quality or integrity. Connecting to boards by conventional means, such as signal-carrying mechanical connectors, generally creates discontinuities, requiring expensive electronics to negotiate. Conventional mechanical connectors may also wear out over time, require precise alignment and manufacturing methods, and are susceptible to mechanical jostling. Finally, conventional mechanical connectors are bulky in comparison to other components typically found mounted on a PCB or otherwise within an apparatus such as a portable electronic device, thus adding significant bulk to the overall dimensions of the device. This is true when the mechanical connector is between two internal circuits, and especially true when the mechanical connector is configured to allow connection between two devices.

BRIEF SUMMARY

In an example, an electronic device may include a first electronic circuit and a second electronic circuit. The electronic device may also have an internal communication link providing a signal path for conducting communication signals between the first electronic circuit and the second electronic circuit. An interface circuit operatively coupled to the internal communication link. The interface circuit may include an extremely high frequency (EHF) communications circuit configured to receive an EHF electromagnetic signal from an external device and generate from the received EHF electromagnetic signal a receive communication signal. This receive communication signal may be selectively applied by the interface circuit to the internal communication link. The external device may control the electronic device with the EHF electromagnetic signal.

In another example, an electronic device may include a first electronic circuit and a second electronic circuit. The electronic device may also have an internal communication link providing a signal path for conducting communication signals between the first electronic circuit and the second electronic circuit. An interface circuit may be operatively coupled to the internal communication link. The interface circuit may include an EHF communications circuit configured to transmit to an external device an EHF electromagnetic signal representative of a communication signal conducted on the internal communication link. The external device may use such an EHF electromagnetic signal to monitor the electronic device.

In another example, an electronic device may include a controller configured to generate a transmit communication signal appropriate for controlling an operation of an external device by applying the transmit communication signal to a communication link between two circuits in the external device. Also, an extremely high frequency (EHF) communications circuit operatively coupled to the controller and configured to convert the transmit communication signal into a transmit EHF electromagnetic signal and transmit the transmit EHF electromagnetic signal to the external device.

In another example, an electronic system may include a first device and a second device external to the first device. The first device may include a first electronic circuit, an operational component and an internal communication link providing a signal path for conducting communication signals between the first electronic circuit and the operational component. A first interface circuit may be operatively coupled to the internal communication link and include a first EHF communications circuit configured to receive an EHF electromagnetic signal from an external device and generate from the received EHF electromagnetic signal a receive communication signal, the interface circuit selectively applying the receive communication signal to the internal communication link.

The second device may include a controller configured to generate a transmit communication signal appropriate for controlling an operation of an external device by applying the transmit communication signal to a communication link between two circuits in the external device. A second EHF communications circuit may be operatively coupled to the controller and configured to convert the transmit communication signal into a transmit EHF electromagnetic signal and transmit the transmit EHF electromagnetic signal to the first device. Further, the first and second EHF communication circuits may provide an EHF electromagnetic communication link when the first device and the second device are positioned with the first EHF communication circuit and the second EHF communication circuit in proximity.

In yet another example, a method of communication between a first EHF-communication enabled device and a second EHF-communication enabled device is provided. In the method the first EHF-communication enabled device may be placed in close proximity to the second EHF-communication enabled device. Thereafter, the first EHF-communication enabled device may transmit an EHF signal and the second EHF-communication enabled device may receive the EHF signal transmitted by the first EHF-communication enabled device. This signal may then be interpreted by the first EHF-communication enabled device, and a response to the interpreted EHF signal is generated by enabling at least one of monitoring of the second EHF-communication enabled device by the first EHF-communication enabled device and controlling by the first EHF-communication enabled device a function of the second EHF-communication enabled device.

BRIEF DESCRIPTION OF THE DRAWINGS

The features of methods and apparatus that are believed to be novel are set forth with particularity in the appended claims. The following description references the accompanying drawings. These drawings and the associated description are provided to illustrate some embodiments of the inventions, and not to limit the scope of the inventions.

FIG. 5 is an isometric view of a portion of two illustrative devices communicating via two pairs of EHF communication units;

FIG. 6 is an isometric view of a portion of two other illustrative devices communicating via one pair of EHF communication units.

Figure 1:
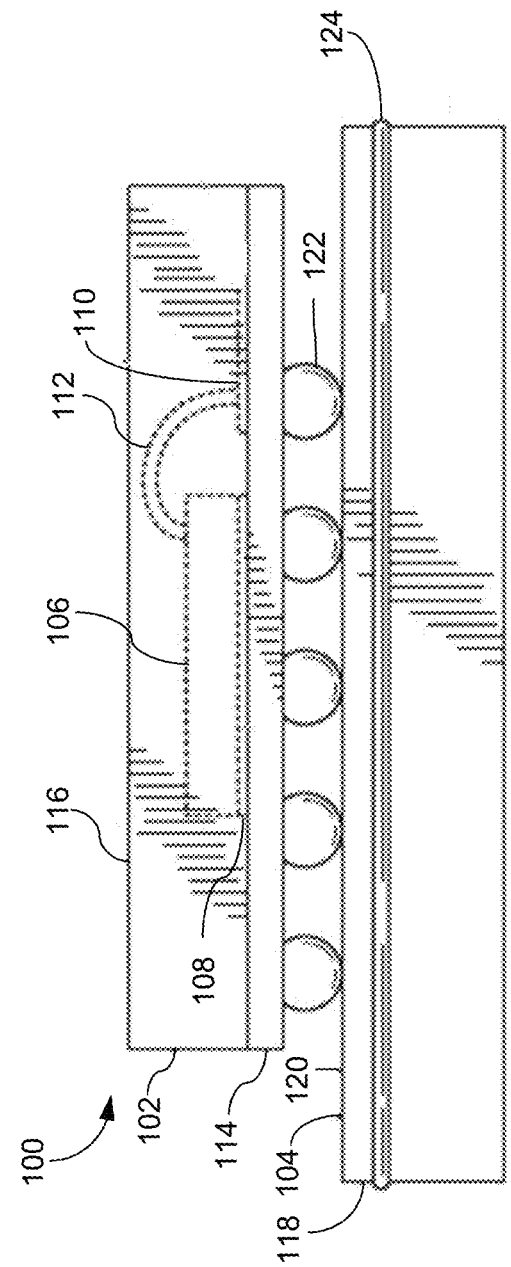
FIG. 1 shows a side view of an exemplary communication unit including an IC package and PCB.

Those with ordinary skill in the art will appreciate that the elements in the figures are illustrated for simplicity and clarity and are not necessarily drawn to scale. For example, the dimensions of some of the elements in the figures may be exaggerated, relative to other elements, in order to improve the understanding of the disclosure.

There may be additional structures described in the description that are not depicted in the drawings, and the absence of such a drawing should not be considered as an omission of such design from the specification.

DETAILED DESCRIPTION

Before describing the present invention in detail, it should be observed that the present invention utilizes apparatus components and method steps related to electronic devices capable of EHF communication. Accordingly the apparatus components have been represented where appropriate by conventional symbols in the drawings, showing specific details that are pertinent for an understanding of the present invention so as not to obscure the disclosure with details that will be readily apparent to those with ordinary skill in the art having the benefit of the description herein. While the specification concludes with the claims defining the features that are regarded as novel, it is believed that the claims will be better understood from a consideration of the following description in conjunction with the drawings.

As required, detailed embodiments are disclosed herein; however, it is to be understood that the disclosed embodiments are merely exemplary of the claimed elements, which can be embodied in various forms. Therefore, specific structural and functional details disclosed herein are not to be interpreted as limiting, but merely as a basis for the claims and as a representative basis for teaching one skilled in the art to variously employ the disclosed concepts in an appropriate structure. Further, the terms and phrases used herein are not intended to be limiting but rather to provide an understandable description of the subject matter.

Furthermore, in today's society and ubiquitous computing environment, high-bandwidth modular and portable memory devices are being used increasingly. Methods and apparatus using EHF communication may provide secure, stable, and high-bandwidth communication between and within these devices.

An example of an EHF communications unit is an EHF comm-link chip. Throughout this disclosure, the terms comm-link chip, comm-link chip package, and EHF communication link chip package will be used to refer to EHF antennas embedded in IC packages. Examples of such comm-link chips are described in detail in U.S. Provisional Patent Applications Ser. Nos. 61/491,811, 61/467,334, 61/485,543, and 61/535,277, all of which are hereby incorporated in their entireties for all purposes. Comm-link chips are an example of a communication device, also referred to as a communication unit, whether or not they provide wireless communication and whether or not they operate in the EHF frequency band.

FIG. 1 shows a representative side view of a communication unit 100 including an IC package 102 flip-mounted to an exemplary printed circuit board (PCB) 104. In this example, it may be seen that IC package 102 includes a die 106, a ground plane 108, an antenna 110, bond wires, including bond wire 112, connecting die 106 to the antenna 110. Die 106, antenna 110, and bond wires 112 are mounted on a package substrate 114 and encapsulated in encapsulating material 116. Ground plane 108 may be mounted to a lower surface of die 106, and may be any suitable structure configured to provide an electrical ground for die 106. The PCB 104 may include a top dielectric layer 118 having a major face or surface 120. IC package 102 is flip-mounted to surface 120 with flip-mounting bumps 122 attached to a metallization pattern (not shown).

Die 106 may include any suitable structure configured as a miniaturized circuit on a suitable die substrate, and is functionally equivalent to a component also referred to as a chip or an integrated circuit (IC). A die substrate may be any suitable semiconductor material; for example, a die substrate may be silicon. In an embodiment, die 106 may have a length and a width dimension, each of which may be about 1.0 mm to about 2.0 mm, and preferably about 1.2 mm to about 1.5 mm. Die 106 may be mounted with further electrical conductors, such as a lead frame, (not shown in FIG. 1), providing connection to external circuits. Further, a transformer (not shown) may also be provided to provide impedance matching between a circuit on die 106 and antenna 110.

Antenna 110 may be in the form of a folded dipole or a loop antenna. In an example, antenna 110 may be configured to operate at radio frequencies such as in the EHF spectrum, and may be configured to transmit and/or receive electromagnetic signal, in other words to act as a transmitter, a receiver, or a transceiver. Antenna 110 may be separate from but operatively connected to the die 106 by suitable conductors like the bond wires 112, and may be located proximal to die 106. In an embodiment, dimensions of antenna 110 are suitable for operation in the EHF band of the electromagnetic frequency spectrum.

Encapsulating material 116 may be used to assist in holding the various components of the IC package 102 in fixed relative positions. Encapsulating material 116 may be any suitable material configured to provide electrical insulation and physical protection for the electrical and electronic components of IC package 102. For example, encapsulating material 116, also referred to as insulating material, may be a mold compound, glass, plastic, or ceramic. The encapsulating material may also be formed in any suitable shape. For example, the encapsulating material may be in the form of a rectangular block, encapsulating all components of the IC package except the unconnected ends of conductors connecting the die to external circuits. External connections may be formed with other circuits or components. For example, external connections may include ball pads and/or external solder balls for connection to a printed circuit board.

PCB 104 may further include a layer 124 spaced from the surface 120 made of conductive material forming a ground plane within the PCB. The PCB ground plane may be any suitable structure configured to provide an electrical ground to circuits and components on PCB 104.

Figure 2:
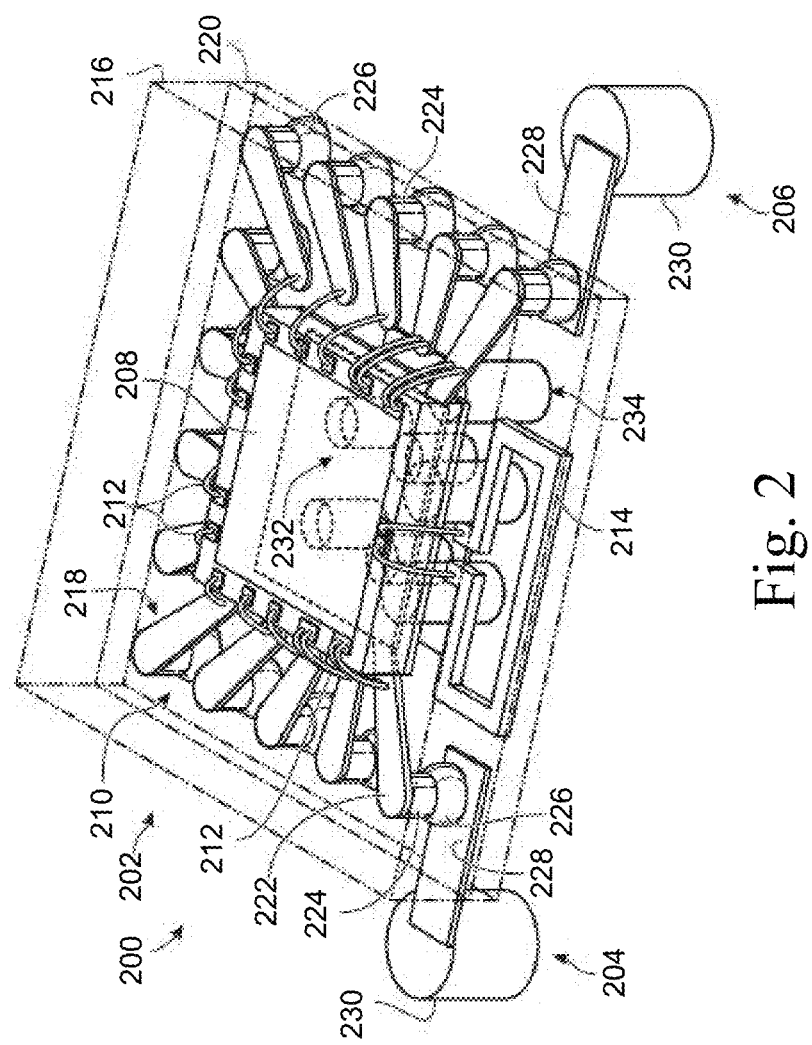
FIG. 2 is an isometric view of another exemplary communication unit including an IC package with external circuit conductors.

Turning to FIG. 2, another exemplary communication unit 200 is shown including an IC package 202 with external circuit conductors 204 and 206. In this example, IC package 202 may include a die 208, a lead frame 210, conductive connectors 212 in the form of bond wires, an antenna 214, encapsulating material 216, and other components not shown to simplify the illustration. Die 208 may be mounted in electrical communication with lead frame 210, which may be any suitable arrangement of electrical conductors or leads 218 configured to allow one or more other circuits to operatively connect with the die. The antenna may be constructed as a part of the manufacturing process that produces the lead frame.

Leads 218 may be embedded or fixed in a lead frame substrate 220, shown in phantom lines, corresponding to package substrate 114. The lead frame substrate may be any suitable insulating material configured to substantially hold the leads in a predetermined arrangement. Electrical communication between the die and the leads of the lead frame may be accomplished by any suitable method using the conductive connectors. As mentioned, conductive connectors 212 may include bond wires that electrically connect terminals on a circuit of die 208 with corresponding lead conductors 218. For example, a conductor or the leads may include a plated lead 222 formed on an upper surface of lead frame substrate 220, a via 224 extending through the substrate, a flip-mounting bump 226 mounting the IC package 202 to a circuit on a base substrate, such as a PCB, not shown. The circuit on the base substrate may include external conductors, such as external conductor 204, which for example, may include a strip conductor 228 connecting bump 226 to a further via 230 extending through the base substrate. Other vias 232 may extend through the lead frame substrate 220 and there may be additional vias 234 extending through the base substrate.

In another example, die 208 may be inverted and conductive connectors 212 may include bumps, or die solder balls, as described previously, which may be configured to electrically connect points on a circuit of the die directly to corresponding leads 218 in what is commonly known as a "flip chip" arrangement.

In one example, first and second communication units, similar to communication units 100 and 200 may be co-located on a single PCB and may provide intra-PCB communication. In other examples, a first communication device may be located on a first PCB and a second communication device may be located on a second PCB and may therefore provide inter-PCB communication. In an embodiment, either of the two communication devices may be configured to transmit and/or receive electromagnetic signals, providing one- or two-way communication between the first and the second communication devices respectively, and accompanying electronic circuits or components.

Figure 3:
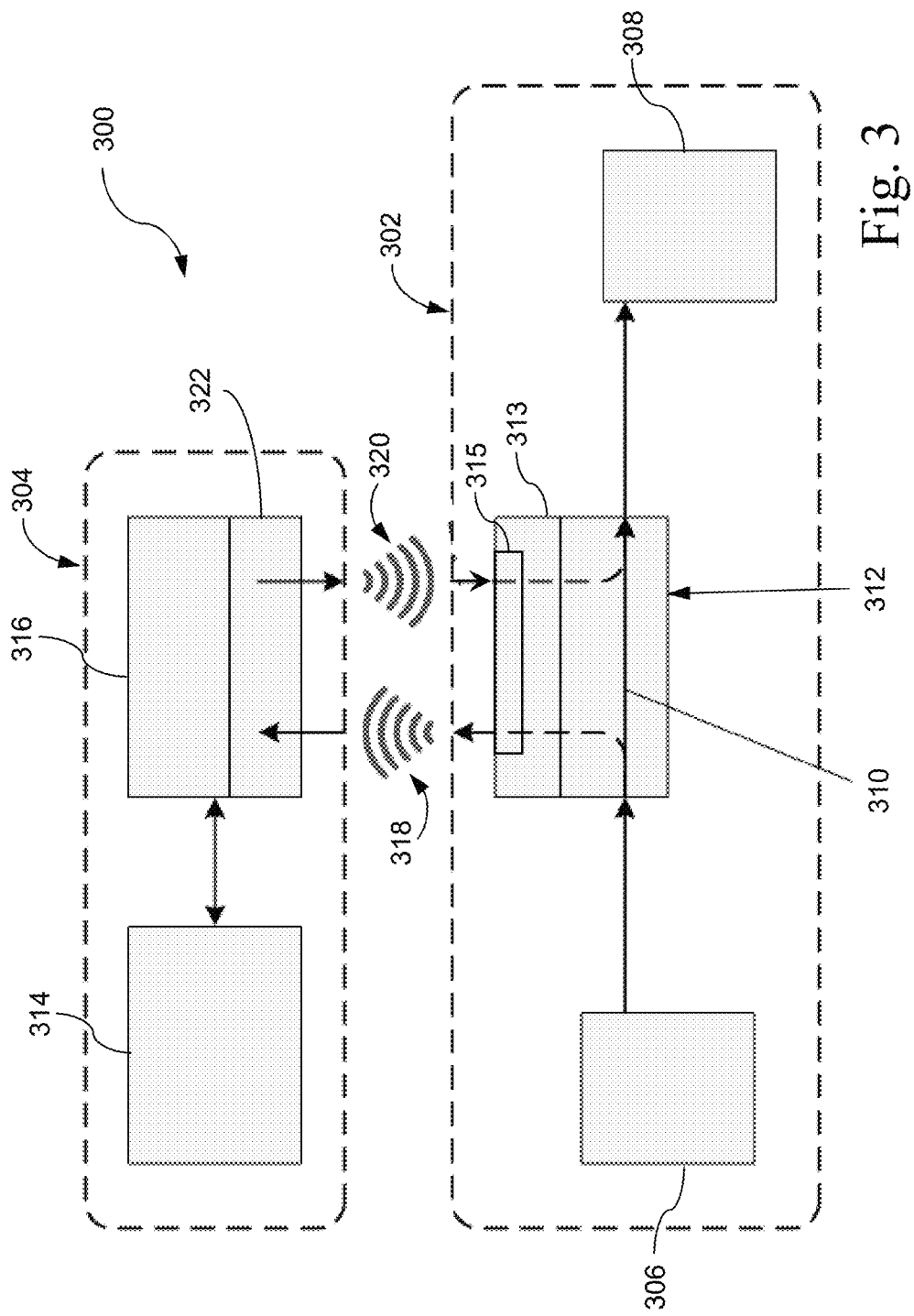
FIG. 3 is a block diagram showing two illustrative devices communicating via EHF communication circuits.

Referring now to FIG. 3, a block diagram depicting an electronic system 300 that includes a first electronic device 302 and second electronic device 304 external to and configured to enable monitoring or other control of the first electronic device.

First electronic device 302 includes a first electronic circuit 306, a second electronic circuit 308, and an internal communication link 310 providing a signal path for conducting communication signals between the first and second electronic circuits. The first and second electronic circuits may be portions of a larger circuit or may be separate circuits with different functionality. Further, the first electronic device 302 may also inlcude an interface circuit 312 operatively coupled to the internal communication link and including a first EHF communication circuit 313. First EHF communication circuit 313 may include one or more EHF communication units, such as EHF communication unit 315, and may be configured to transmit an EHF electromagnetic signal 318 and/or receive an EHF electromagnetic signal 320, to and from an external device, like the second electronic device 304. In an example, the first EHF communication circuit may generate from a received EHF electromagnetic signal, a receive communication signal. In an example, the interface circuit may selectively apply the receive communication signal to the internal communication link 310. In another example, the interface circuit may be configured to transmit to an external device, like the second electronic device 304, an EHF electromagnetic signal representative of a communication signal conducted on the internal communication link 310.

In an embodiment, first electronic device 302 may further include a second EHF communications circuit (not shown) configured to generate an EHF electromagnetic signal from an internal communication signal conducted on the internal communication link 310, and transmit the generated EHF electromagnetic signal to the second electronic device 304. Also, the first EHF communication circuit 312 may be configured to transmit a modulated EHF signal representing communication signals between the first electronic circuit 306 and the second electronic circuit 308 or transmit a modulated EHF signal, which may represent an output of one of the first and second electronic circuits.

The second electronic device 304 may include a controlling circuit 314 and a second EHF communication circuit 316. The second EHF communication circuit may include one or more EHF communication units, such as EHF communication unit 322 configured to receive and interpret an EHF signal transmitted by first electronic device 302. Further, based on the interpretation the EHF communication circuit generates a receive transmission signal that is in turn used by the controlling circuit to generate a transmit communication signal appropriate for monitoring or otherwise controlling an operation of the first electronic device 302 by applying the transmit communication signal to the communication link 310 between first and second electronic circuits 306 and 308.

In an example, the second electronic circuit 308 can include an operational component. In a case, the operational component may be a processor and the controlling circuit 314 may be configured to generate the transmit communication signal appropriate for selectively bypassing signal communication between the first electronic circuit 306 and the processor of second electronic circuit 308 of the first device and enable control of the processor of the first device 302 by the second device 304. Similarly, in another example, first and second EHF communication circuits 312 and 316 may be configured to selectively monitor signal communication between the first electronic circuit 306 and the processor in second electronic circuit 308. Optionally, the second device may provide different information to or control operation of the second electronic circuit based on information received from the first electronic circuit.

In some examples, the first electronic circuit may include a processor and the second electronic circuit may include a data storage component as an operational component. Second device 304 may take over control of the data storage component in the first device. In this example, the controlling circuit may be configured to read contents of the data storage component and the interface circuit may be configured to write the contents to the data storage component.

For example, first electronic device 302 may include a first EHF communication unit that is in communication with the data storage component. In this example, the first electronic device may be placed such that the first EHF communication unit is in proximity with the second EHF communication unit. Placing the devices in proximity may enable data to be electromagnetically transferred between a processor in second electronic device 302 and the data storage component by transferring data between the processor in controlling circuit 314 and EHF communication unit 322, transferring electromagnetic signals between the EHF communication unit 322 and the EHF communication unit 313, and transferring data between the EHF communication unit 313 and data storage component in electronic circuit 308.

Figure 4:
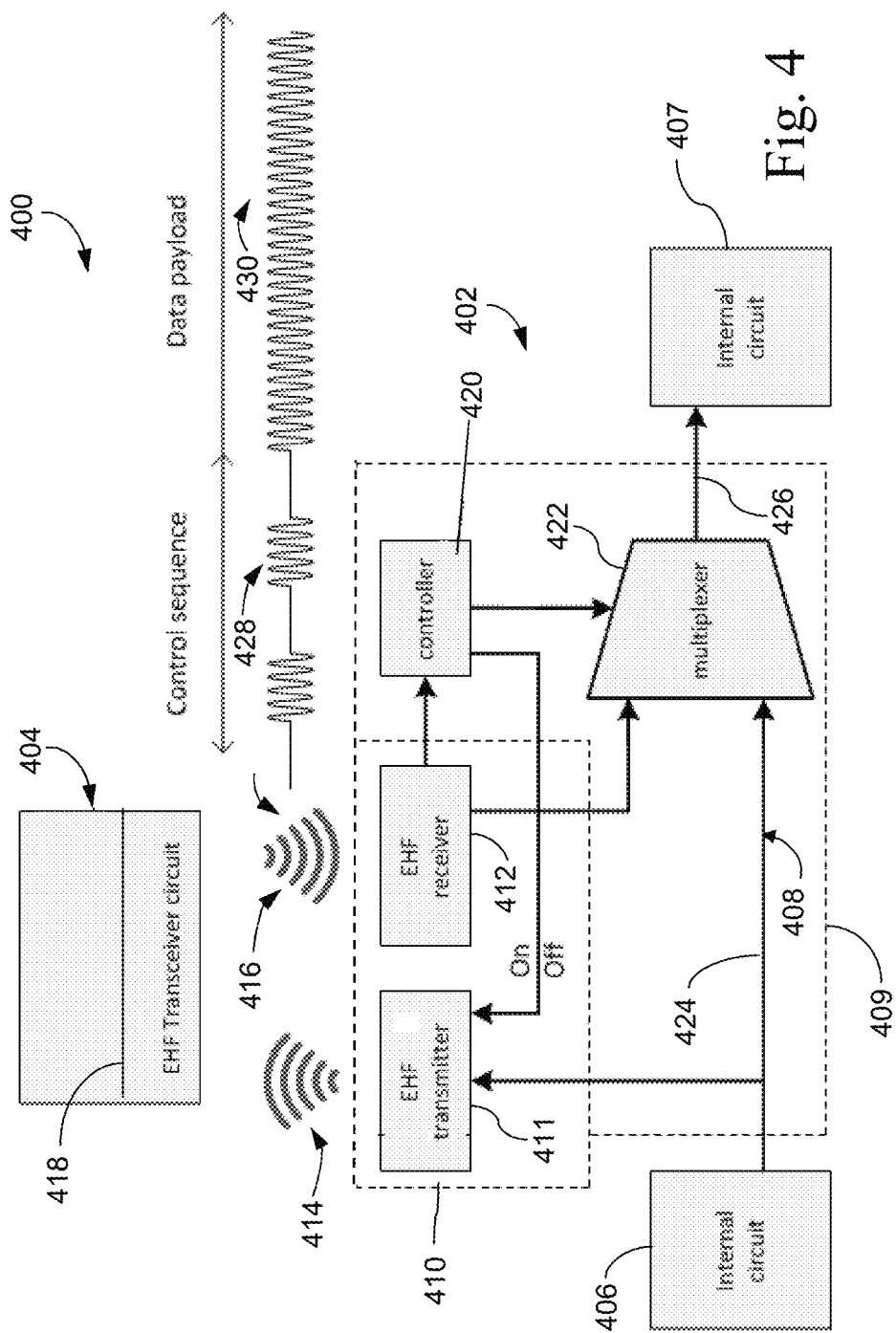
FIG. 4 is a block diagram showing another example of two illustrative devices communicating via EHF communication circuits.

Referring to FIG. 4, a block diagram is shown depicting an exemplary electronic system 400 configured to enable monitoring or other control of an electronic device 402 by an external device 404 is shown. Electronic device 402 is shown to include a first electronic circuit 406 and a second electronic circuit 407 in communication by an interconnecting signal pathway or communication link 408. Further, the first electronic device 402 may also inlcude an interface circuit 409 having a first EHF communications circuit 410 including EHF communication units 411 and 412. EHF communication units 411 and 412 may be configured, respectively, to transmit and receive EHF electromagnetic signals, such as transmit signal 414 and receive signal 416, transmitted to and received from an external device, like second electronic device 304. Accordingly, second electronic device 404 may include a second EHF communication circuit 418 that may be configured to act as a transceiver for communicating with electronic device 402.

Interface circuit 409 may also include a controller 420 and a multiplexer 422. Further, communication link 408 may include a first communication link portion 424 connecting an output of electronic circuit 406 with an input of multiplexer 422, and a second link portion 426 connecting an output of the multiplexer with an input to electronic circuit 407. The communication link thus provides communication between the two electronic circuits via the multiplexer.

In an embodiment, a signal from the receiver EHF communication unit 412 may also be routed to another input of multiplexer 422. Accordingly, the multiplexer may have a receiver-generated input and an internal communication link input. The controller may be configured to receive a signal from receiver EHF communication unit 412 and, in response to an interpretation of that signal, control the multiplexer to switch between the internal communication link input and the receiver generated input, thus linking one or the other signal path to the electronic circuit 407 and controlling operation of the multiplexer to selectively substitute the communication signal received from the external device 404.

Additionally, the controller may also be configured to selectively enable or disable transmitter EHF communication unit 411 in response to the received EHF electromagnetic signal to substitute on the internal communication link a communication signal received from the external device 404 for a communication signal generated by one of the first and second electronic circuits 406 and 407. This arrangement may allow first device 402 to transmit an EHF signal 416, such as the one illustrated in FIG. 4. In an embodiment, receive signal 416 may contain a control sequence 428 and a data payload 430. Control sequence 428 may be interpreted by controller 420 as a signal to enable or disable the transmitter EHF communication unit and/or to switch the multiplexer 422 between inputs. The data payload 430 may subsequently be routed to the second electronic circuit 407 or ignored, while a signal from first electronic circuit 406 may be transmitted or isolated, or any combination of these actions. This allows external second electronic device 404 to selectively control, monitor, or transfer data to and from the first electronic device 402, such as for monitoring information conducted on communication link 408 or controlling operation of an operational component, such as second electronic circuit 407.

In an example, controller 420 may be configured to respond to a received EHF electromagnetic signal to substitute on the internal communication link the communication signal generated by one of first electronic circuit 406 and second electronic circuit 407. In another example, the controller may be configured to direct an internal signal generated by the first electronic device 402 to the second electronic device 404 and to direct the communication signal received from the second electronic device to second electronic circuit 407.

FIGS. 5 to 7 illustrate various simplified exemplary systems having two electronic devices in communication. In FIG. 5, a communication system 500 includes first and second electronic devices 502 and 504. First electronic device 502 is shown to include two EHF communication units 506 and 508, acting as a transmitter and a receiver respectively, which are configured to pair with two corresponding EHF communication units 510 and 512 on second electronic device 504 such that a signal pathway or communication link 513 between two operational components 514 and 516 may be monitored or otherwise controlled.

In an embodiment, the EHF communication units may configured and aligned when the first and second electronic devices are placed in close proximity to each other, thereby enabling contactless signal monitoring or other form of control of the first electronic device 502 by the second electronic device 504, data transfer from the second electronic device and the first electronic device.

Similarly in FIG. 6 there is shown a similar arrangement. Specifically, a communication system 600 includes first and second electronic devices 602 and 604. In this example, first electronic device 602 is shown to include a single EHF communication unit 606, functioning as a transceiver and second electronic device 604 is shown to include a single EHF communication unit 608 also functioning as a transceiver. The two EHF communication units are configured to communicate as described above such that a signal pathway or communication link 609, coupled to EHF communication unit 606, and extending between two operational components 610 and 612 may be monitored or otherwise controlled.

Figure 7B:
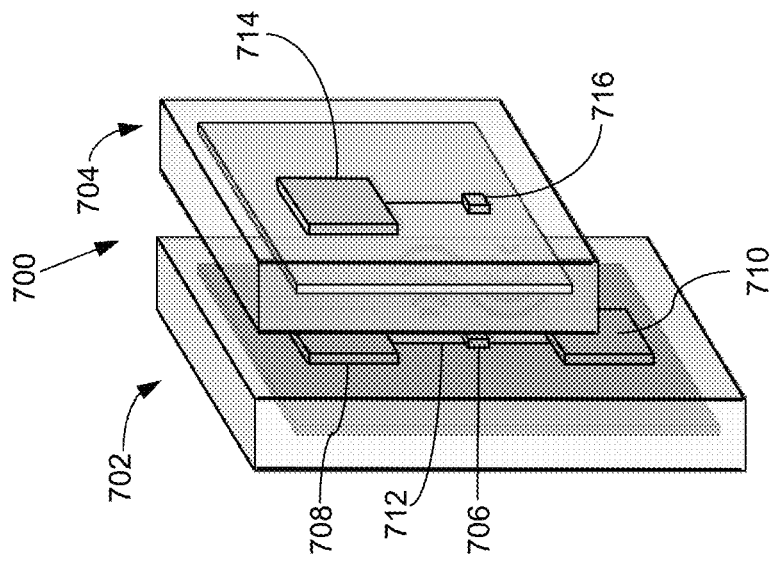
FIGS. 7A and 7B show simplified isometric views of two illustrative devices in spaced relationship without intercommunication and in proximity with intercommunication.
Figure 7A:
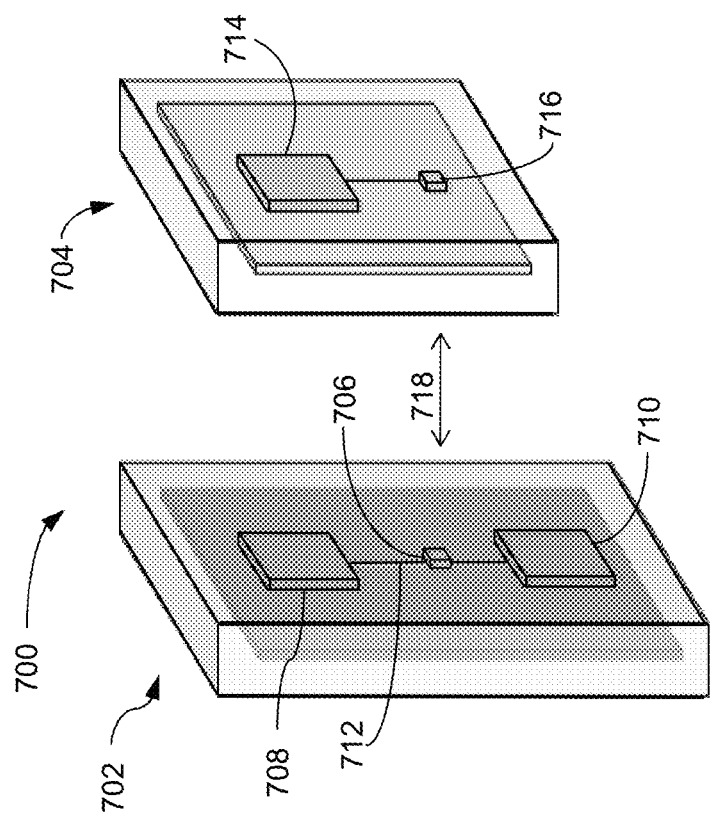

FIG. 7A illustrates a representative communication system 700 similar to system 600 having first and second electronic devices 702 and 704. First electronic device 702 is shown to include an EHF communication unit 706, functioning as a transceiver, operational components 708 and 710, such as electronic circuits, and a communication link 712 providing communication between the operational components and coupled to EHF communication circuit 706. Second electronic device 704 includes a controller 714 and an EHF communication circuit 716 in communication with the controller. The two EHF communication circuits are configured to communicate as described above along a communication signal path 718.

Figure 8B:
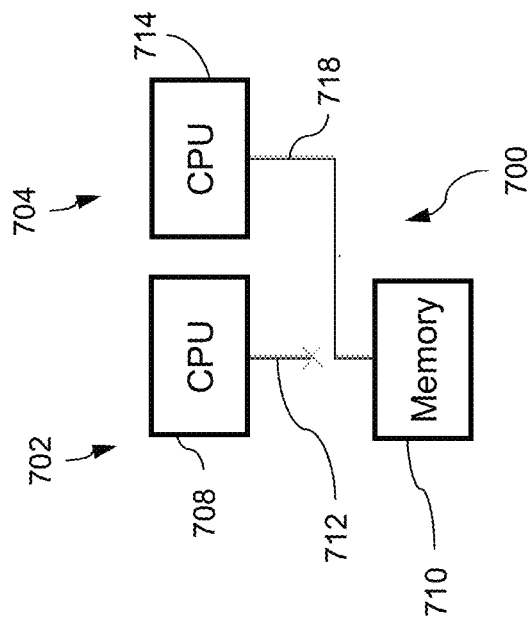
FIGS. 8A and 8B show simplified block diagrams of the devices of FIGS. 7A and 7B in spaced and proximal positions.
Figure 8A:
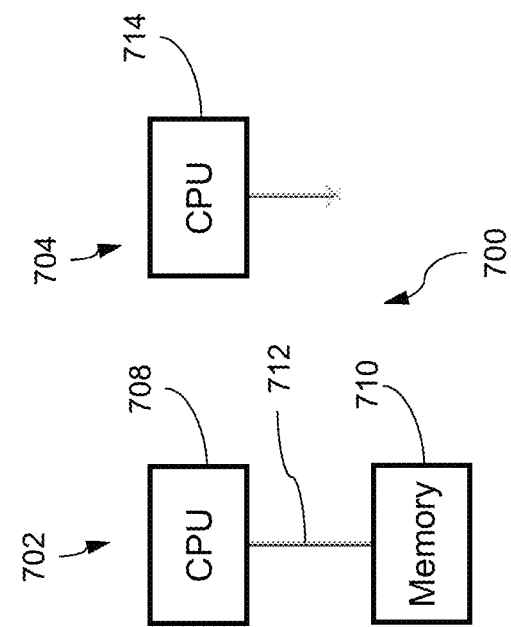

However, in the positions shown the first and second electronic devices are spaced apart too far to enable communication between the respective EHF communication circuits. FIG. 8A illustrates simplistically a further example of system 700 with the electronic devices in the positions shown in FIG. 7A. In this example, operational component 708 of electronic device 702 includes a CPU and operational component 710 includes a data storage device, such as a memory. Controller 714 of electronic device 704 also includes a CPU and may include a data storage device as well. Communication link 712 is shown connecting operational components 708 and 710. Communication signal path 718 is shown terminated with an 'X' indicating there is no communication between the CPU of controller 714 and communication link 712 over communication signal path 718.

FIG. 7B illustrates the position of electronic devices 702 and 704 when they are placed proximate each other appropriately to establish communication signal path 718. When in this position, electronic device 704 may send signals to electronic device 702 to substitute the data transmitted from the CPU of controller 714 for the data that would otherwise be transmitted from the CPU of operational component 708 to the memory of operational component 710. In some examples, data from a data storage device on one electronic device may be communicated to the other electronic device and may be stored on a data storage device of the other electronic device. This may be achieved by appropriate control circuitry in electronic device 702, such as are provided in interface circuit 409 of electronic device 402 described above. This reconfiguration of the signal paths is illustrated in FIG. 8B, which shows a signal path from the CPU of controller 714 to the memory of operational component 710, but the signal path from the CPU of operational component 708 provided normally by communication link 712 is not terminated at operational component 710.

It will be appreciated that systems, devices, and methods as described above for providing wireless communication may include one or more of the following examples.

In an example, an electronic device may include a first electronic circuit and a second electronic circuit. The electronic device may also include an internal communication link providing a signal path for conducting communication signals between the first electronic circuit and the second electronic circuit. An interface circuit may be operatively coupled to the internal communication link. The interface circuit may include an EHF communications circuit configured to receive an EHF electromagnetic signal from an external device and generate from the received EHF electromagnetic signal a receive communication signal. This receive communication signal may be selectively applied by the interface circuit to the internal communication link, thereby enabling the external device to control the electronic device.

Further, the electronic device may also include a second EHF communications circuit configured to generate an EHF electromagnetic signal from an internal communication signal conducted on the internal communication link, and transmit the generated EHF electromagnetic signal to the external device. Also, the EHF communications circuit may be configured to transmit a modulated EHF signal representing communication signals between the first electronic circuit and the second electronic circuit. In another example, the EHF communications circuit may be configured to transmit a modulated EHF signal representing an output of the first electronic circuit.

In an embodiment, the interface circuit may include a controller configured to enable or disable a transmit EHF communications circuit in response to the received EHF electromagnetic signal. In response to the received EHF electromagnetic signal, the controller may substitute on the internal communication link a communication signal received from the external device for a communication signal generated by one of the first and second electronic circuits.

In another embodiment, the interface circuit may include a multiplexer having as inputs the communication signal from the external device and the internal communication link from the first circuit, such that the controller may selectively substitute the communication signal received from the external device by controlling operation of the multiplexer.

In an embodiment, the controller may be configured to respond to the received EHF electromagnetic signal to substitute on the internal communication link the communication signal generated by one of the first and second circuits. In another embodiment, the controller may be configured to direct an internal signal generated by the first electronic circuit to the external device and to direct the communication signal received from the external device to the second electronic circuit.

In another example, an electronic device including a first electronic circuit and a second electronic circuit is provided. The electronic device may be provided with an internal communication link providing a signal path for conducting communication signals between the first electronic circuit and the second electronic circuit. An interface circuit may be operatively coupled to the internal communication link. The interface circuit includes an extremely high frequency (EHF) communications circuit configured to transmit to an external device an EHF electromagnetic signal representative of a communication signal conducted on the internal communication link, thereby enabling the external device to monitor the electronic device.

In another example, an electronic device is provided. The electronic device may include a controller configured to generate a transmit communication signal appropriate for controlling an operation of an external device by applying the transmit communication signal to a communication link between two circuits in the external device. An extremely high frequency (EHF) communications circuit may be operatively coupled to the controller and configured to convert the transmit communication signal into a transmit EHF electromagnetic signal and transmit the transmit EHF electromagnetic signal to the external device.

In an example, the EHF communication circuit may be configured to receive a receive EHF electromagnetic signal communicated from the communication link of the external device and generate a receive communication signal. The controller may further be configured to generate the transmit communication signal in response to the receive communication signal.

In another example, the controller may be further configured to generate the transmit communication signal as a signal to be conducted to one of the two circuits on the communication link of the external device.

In another example, an electronic system may include a first device and a second device external to the first device. The first device may include a first electronic circuit, an operational component and an internal communication link providing a signal path for conducting communication signals between the first electronic circuit and the operational component. Also provided is a first interface circuit operatively coupled to the internal communication link and including a first EHF communications circuit configured to receive an EHF electromagnetic signal from an external device and generate from the received EHF electromagnetic signal a receive communication signal, the interface circuit selectively applying the receive communication signal to the internal communication link.

The second device may include a controller configured to generate a transmit communication signal appropriate for controlling an operation of an external device by applying the transmit communication signal to a communication link between two circuits in the external device. An extremely high frequency (EHF) communications circuit may be operatively coupled to the controller and configured to convert the transmit communication signal into a transmit EHF electromagnetic signal and transmit the transmit EHF electromagnetic signal to the first device. The first and second EHF communication circuits may provide an EHF electromagnetic communication link when the first device and the second device are positioned with the first EHF communication circuit and the second EHF communication circuit in proximity.

In an embodiment, the controller in the electronic system may be configured to generate the transmit communication signal appropriate for selectively bypassing signal communication between the first electronic circuit and the operational component of the first device, and enabling control of the operational component of the first device by the second device.

In another embodiment, the first EHF communication circuit and the second EHF communication circuit may be configured to selectively monitor signal communication between the first electronic circuit and the operational component of the first device.

In yet another embodiment, the first device may comprise a first data storage component and a second storage component, respectively, wherein the controller may be configured to read contents of the second data storage component and the interface circuit may be configured to write the contents to the first data storage component.

One or both of the first and second EHF communication circuits may include an EHF communication unit that includes an integrated circuit (IC), an antenna operatively connected to the IC, a lead frame, a ground plane operatively connected to the IC and an insulating material encapsulating the IC, the lead frame, the ground plane, and the antenna to form an IC package.

The EHF communication units may be configured and aligned when the first device is placed in close proximity to the second device, thereby enabling contactless signal monitoring of the first device by the second device. Also, the EHF communication units may be configured and aligned when the second device is placed in close proximity to the first device, thereby enabling contactless data transfer from the second device and the first device. In another embodiment, the EHF communication units may be configured and aligned when the second device in placed in close proximity to the first device, thereby enabling contactless control of the first device by the second device.

In yet another example, a method may provide communication between a first EHF-communication enabled device and a second EHF-communication enabled device. In the method the first EHF-communication enabled device may be placed in close proximity to the second EHF-communication enabled device. Thereafter, the first EHF-communication enabled device may transmit an EHF signal and the second EHF-communication enabled device may receive the EHF signal transmitted by the first EHF-communication enabled device. This signal may then be interpreted by the first EHF-communication enabled device, and a response to the interpreted EHF signal may be generated by enabling at least one of monitoring of the second EHF-communication enabled device by the first EHF-communication enabled device and controlling by the first EHF-communication enabled device of a function of the second EHF-communication enabled device.

INDUSTRIAL APPLICABILITY

The inventions described herein relate to industrial and commercial industries, such as electronics and communications industries using devices that communicate with other devices or devices having communication between components in the devices.

It is believed that the disclosure set forth herein encompasses multiple distinct inventions with independent utility. While each of these inventions has been disclosed in its preferred form, the specific embodiments thereof as disclosed and illustrated herein are not to be considered in a limiting sense as numerous variations are possible. Each example defines an embodiment disclosed in the foregoing disclosure, but any one example does not necessarily encompass all features or combinations that may be eventually claimed. The present invention is intended to embrace all such alternatives, modifications and variances that fall within the scope of the appended claims.

Where the description recites "a" or "a first" element or the equivalent thereof, such description includes one or more such elements, neither requiring nor excluding two or more such elements. The term "another", as used herein includes at least a second or more. The terms "including" and/or "having" as used herein are synonymous with 'comprising.' Further, ordinal indicators, such as first, second or third, for identified elements are used to distinguish between the elements, and do not indicate a required or limited number of such elements, and do not indicate a particular position or order of such elements unless otherwise specifically stated.

What is claimed is:
1. An electronic device comprising:
a first electronic circuit having an output coupled to a first input of a multiplexer using an internal communication link included in an interface circuit;
a second electronic circuit having an input coupled to an output of the multiplexer; and
the interface circuit including a first extremely high frequency (EHF) communications circuit comprising:
an input coupled to receive an EHF electromagnetic signal from an external device,
a first output coupled to send a data payload included in the EHF signal received from the external device to a second input of the multiplexer and,
a second output coupled to send a control sequence included in the EHF signal received from the external device to a controller the controller configured to send a control signal to the multiplexer, and the multiplexer configured to select whether to send to the input of the second electronic curcuit:
  the data payload included in the EHF signal received from the external device, or
  the output of the first electronic curcuit from the internal communication link based on the control sequence.

2. The electronic device according to claim 1, further comprising a second EHF communications circuit having a first input coupled to receive an internal communication signal from the internal communication link, and having an output configured to transmit an EHF electromagnetic signal generated from the internal communication signal to the external device.

3. The electronic device according to claim 2, wherein the second EHF communications circuit includes a transmitter configured to transmit a modulated EHF signal representing communication signals between the first electronic circuit and the second electronic circuit.

4. The electronic device according to claim 2, wherein the second EHF communications circuit includes a transmitter configured to transmit a modulated EHF signal representing an output of the first electronic circuit.

5. The electronic device according to claim 2, wherein the controller is configured to output a control signal to enable or disable a transmitter included in the second EHF communications circuit based on the control sequence included in the EHF signal received from the external device.

6. The electronic device according to claim 5, wherein the controller is configured to substitute on the internal communication link the internal communication signal based on the control sequence included in the EHF signal received from the external device, the internal communication signal generated by one of the first or second electronic circuits.

7. The electronic device according to claim 5, wherein the controller is configured to direct an internal communication signal generated by the first electronic circuit to the external device and to direct a communication signal received from the external device to the second electronic circuit based on the control sequence included in the EHF signal received from the external device.

8. An electronic system comprising a first device and a second device external to the first device, the first device comprising:
  a first electronic circuit;
  an operational component; and
  an internal communication link providing a signal path conducting communication signals between the first electronic circuit and the operational component, the first electronic circuit being coupled to the internal communication link and configured to be in communication with the operational component via the internal communication link; and
  a first interface circuit operatively coupled to the internal communication link and including a first extremely high frequency (EHF) communications circuit configured to receive an EHF electromagnetic signal from the second device and generate from the received EHF electromagnetic signal a receive communication signal comprising a data payload and a control sequence, the first interface circuit comprising a multiplexer having a first input coupled to the internal communication link and a second input coupled to an output of the first EHF communications circuit, the multiplexer configured to select whether to send data output by the first electronic circuit using the internal communication link or the data payload output by the first EHF communications circuit, to the operational component based on the control sequence;
  and the second device comprising:
    a controller configured to generate a transmit communication signal for controlling an operation of the operational component of the first device, the transmit communication signal including the data payload and the control sequence; and
    a second extremely high frequency (EHF) communications circuit operatively coupled to the controller and configured to convert the transmit communication signal into a transmit EHF electromagnetic signal, and transmit the transmit EHF electromagnetic signal to the first device, the first and second EHF communication circuits providing an EHF electromagnetic communication link when the first device and the second device are positioned with the first EHF communication circuit and the second EHF communication circuit in proximity.

9. The electronic system according to claim 8, wherein the controller is configured to generate the transmit communication signal for selectively bypassing signal communication between the electronic circuit and the operational component of the first device, and enabling control of the operational component of the first device by the second device.

10. The electronic system according to claim 8, wherein the first EHF communication circuit and the second EHF communication circuit are configured to selectively monitor signal communication between the electronic circuit and the operational component of the first device.

11. The electronic system according to claim 8, wherein the first device and the second device further comprise a first data storage component and a second storage component, respectively, wherein the controller is configured to read contents of the second data storage component and the interface circuit is configured to write the contents to the first data storage component.

12. The electronic system according to claim 8, wherein each of the first and second EHF communication circuits comprises an EHF communication unit, each EHF communication unit comprising:
  an integrated circuit (IC);
  an antenna operatively connected to the IC;
  a lead frame;
  a ground plane operatively connected to the IC; and
  an insulating material encapsulating the IC, the lead frame, the ground plane, and the antenna to comprise an IC package.

* * * * *